United States Patent
Vilner et al.

(10) Patent No.: US 11,640,933 B2
(45) Date of Patent: May 2, 2023

(54) BALL GRID ARRAY PATTERN FOR AN INTEGRATED CIRCUIT

(71) Applicant: Mellanox Technologies, Ltd., Yokneam (IL)

(72) Inventors: Pavel Vilner, Haifa (IL); Dmitry Fliter, Kiryat Yam (IL); Jacov Brener, Rosh Ha'ayin (IL)

(73) Assignee: Mellanox Technologies, Ltd., Yokneam (IL)

(*) Notice: Subject to any disclaimer, the term of this patent is extended or adjusted under 35 U.S.C. 154(b) by 86 days.

(21) Appl. No.: 17/199,025

(22) Filed: Mar. 11, 2021

(65) Prior Publication Data

US 2022/0293500 A1 Sep. 15, 2022

(51) Int. Cl.
*H01L 23/498* (2006.01)
*H01L 23/31* (2006.01)
*H05K 3/34* (2006.01)

(52) U.S. Cl.
CPC .... *H01L 23/49816* (2013.01); *H01L 23/3128* (2013.01); *H01L 23/49838* (2013.01); *H05K 3/3436* (2013.01)

(58) Field of Classification Search
CPC ......... H01L 23/49816; H01L 23/3128; H01L 23/49838; H05K 3/3436
See application file for complete search history.

(56) References Cited

U.S. PATENT DOCUMENTS

| | | | |
|---|---|---|---|
| 10,057,976 B1* | 8/2018 | Shi | H01L 21/4853 |
| 2016/0181682 A1* | 6/2016 | Zhao | H05K 1/0245 |
| | | | 333/5 |
| 2017/0288647 A1* | 10/2017 | Shekhar | H03K 19/0005 |
| 2020/0403705 A1* | 12/2020 | Fathololoumi | H04B 10/508 |
| 2021/0315107 A1* | 10/2021 | Vasudevan | B23K 1/0016 |

* cited by examiner

*Primary Examiner* — Benjamin Tzu-Hung Liu
(74) *Attorney, Agent, or Firm* — Moore & Van Allen PLLC; Michael M. McCraw (57) ABSTRACT

Embodiments are disclosed for providing a ball grid array pattern for an integrated circuit. An example integrated circuit apparatus includes an integrated circuit and a ball grid array. The integrated circuit includes at least a package substrate and a silicon chip. The ball grid array is disposed on the package substrate of the integrated circuit. The ball grid array includes a first set of solder balls that is configured to provide electrical connections for communication channels and a second set of the solder balls associated with an electrical ground. The first set of solder balls includes a first subset of solder balls configured in a first orientation and a second subset of solder balls configured in a second orientation. Furthermore, at least one solder ball from the second set of the solder balls is disposed between the first subset of solder balls and the second subset of solder balls.

20 Claims, 10 Drawing Sheets

BALL GRID ARRAY PATTERN FOR AN INTEGRATED CIRCUIT

TECHNOLOGICAL FIELD

Embodiments of the present invention relate generally to a ball grid array pattern for an integrated circuit.

BACKGROUND

A ball grid array is a type of electrical connection for an integrated circuit that is mounted on a surface (e.g., a substrate) of the integrated circuit. For instance, solder balls of a ball grid array are generally arranged in a grid-shape on a bottom surface of an integrated circuit. However, traditional ball grid arrays arranged in a grid-shape are generally prone to interference between solder balls, inefficient performance for communication channel connections associated with the ball grid array, and/or inefficient power consumption for an integrated circuit associated with the ball grid array. As such, an improved ball grid array for an integrated circuit is desirable.

BRIEF SUMMARY

Example embodiments of the present invention relate generally to system(s), method and apparatus to provide an improved ball grid array pattern for an integrated circuit. The details of some embodiments of the subject matter described in this specification are set forth in the accompanying drawings and the description below. Other features, aspects, and advantages of the subject matter will become apparent from the description, the drawings, and the claims.

In an embodiment, an integrated circuit apparatus comprises an integrated circuit and a ball grid array. The integrated circuit comprises at least a package substrate and a silicon chip. Furthermore, the ball grid array is disposed on the package substrate of the integrated circuit. In one or more embodiments, the ball grid array comprises a first set of solder balls that is configured to provide electrical connections for communication channels associated with the silicon chip and a second set of the solder balls associated with an electrical ground and/or electric power for the silicon chip. In one or more embodiments, the first set of solder balls comprises a first subset of solder balls configured in a first orientation and a second subset of solder balls configured in a second orientation that is different than the first orientation. In one or more embodiments, at least one solder ball from the second set of the solder balls is disposed between the first subset of solder balls and the second subset of solder balls.

In one or more embodiments, the first set of solder balls further comprises a third subset of solder balls configured in the first orientation and a fourth subset of solder balls configured in the second orientation.

In one or more embodiments, at least one other solder ball from the second set of the solder balls is disposed between the third subset of solder balls and the fourth subset of solder balls.

In one or more embodiments, at least one other solder ball from the second set of the solder balls is disposed between the second subset of solder balls and the third subset of solder balls.

In one or more embodiments, the first subset of solder balls and the second subset of solder balls are associated with transmitter communication channels. Furthermore, in one or more embodiments, the third subset of solder balls and the fourth subset of solder balls are associated with receiver communication channels.

In one or more embodiments, the first set of solder balls is surrounded by solder balls from the second set of the solder balls.

In one or more embodiments, the electrical connections are first electrical connections. Furthermore, in one or more embodiments, the ball grid array comprises a third set of solder balls that is configured to provide second electrical connections for a power supply associated with the silicon chip.

In one or more embodiments, at least one other solder ball from the second set of the solder balls is disposed between the first set of solder balls and the third set of solder.

In one or more embodiments, the package substrate defines a first side, a second side, a third side, and a fourth side. Furthermore, in one or more embodiments, the first set of solder balls is arranged along the first side, the second side, and the third side of the package substrate. Furthermore, in one or more embodiments, the third set of solder balls is arranged along the fourth side of the package substrate.

In one or more embodiments, the electrical connections are first electrical connections. Furthermore, in one or more embodiments, the ball grid array comprises a third set of solder balls that is configured to provide second electrical connections for auxiliary signals associated with the silicon chip.

In one or more embodiments, at least one other solder ball from the second set of the solder balls is disposed between the first set of solder balls and the third set of solder balls.

In one or more embodiments, the package substrate defines a first side, a second side, a third side, and a fourth side. Furthermore, in one or more embodiments, the first set of solder balls is arranged along the first side, the second side, and the third side of the package substrate. Furthermore, in one or more embodiments, the third set of solder balls is arranged along the fourth side of the package substrate.

In one or more embodiments, the second orientation associated with the second subset of solder balls is perpendicular with respect to the first orientation associated with the first subset of solder balls.

In one or more embodiments, the ball grid array is disposed between the package substrate and a printed circuit board.

In one or more embodiments, the integrated circuit is an integrated circuit of a network switch, and wherein the ball grid array is disposed between the network switch and a carrier printed circuit board.

In one or more embodiments, the integrated circuit is an integrated circuit for a network adaptor.

In one or more embodiments, the integrated circuit is configured as a graphics processing unit.

In another embodiment, an integrated circuit system comprises an integrated circuit, a printed circuit board, and a ball grid array. The integrated circuit comprises at least a package substrate and a silicon chip. Furthermore, the ball grid array is disposed between the package substrate of the integrated circuit and the printed circuit board. In one or more embodiments, the ball grid array comprises a first set of solder balls that is configured to provide electrical connections for communication channels associated with the silicon chip and a second set of the solder balls associated with an electrical ground and/or electric power for the silicon chip. In one or more embodiments, the first set of solder balls associated with the communication channels comprises a first subset of solder balls configured in a first orientation and a second subset of solder balls configured in a second orientation that is different than the first orientation. In one or more embodiments, at least one solder ball from the second set of the solder balls is disposed between the first subset of solder balls and the second subset of solder balls.

In one or more embodiments, the first set of solder balls comprises a third subset of solder balls configured in the first orientation and a fourth subset of solder balls configured in the second orientation.

In one or more embodiments, at least one other solder ball from the second set of the solder balls is disposed between the third subset of solder balls and the fourth subset of solder balls.

In one or more embodiments, at least one other solder ball from the second set of the solder balls is disposed between the second subset of solder balls and the third subset of solder balls.

In one or more embodiments, the first subset of solder balls and the second subset of solder balls are associated with transmitter communication channels. Furthermore, in one or more embodiments, the third subset of solder balls and the fourth subset of solder balls are associated with receiver communication channels.

In yet another embodiment, a method is provided. The method provides for configuring an electrical signal via a silicon chip of an integrated circuit. The method also provides for transmitting the electrical signal to a printed circuit board via a ball grid array disposed on the integrated circuit, the ball grid array comprising a first set of solder balls that is configured to provide electrical connections for communication channels associated with the silicon chip and a second set of the solder balls associated with an electrical ground and/or electric power for the silicon chip, the first set of solder balls comprising a first subset of solder balls configured in a first orientation and a second subset of solder balls configured in a second orientation that is different than the first orientation, and at least one solder ball from the second set of the solder balls being disposed between the first subset of solder balls and the second subset of solder balls.

The above summary is provided merely for purposes of summarizing some example embodiments to provide a basic understanding of some aspects of the present invention. Accordingly, it will be appreciated that the above-described embodiments are merely examples and should not be construed to narrow the scope or spirit of the present invention in any way. It will be appreciated that the scope of the present invention encompasses many potential embodiments in addition to those here summarized, some of which will be further described below.

BRIEF DESCRIPTION OF THE DRAWINGS

Having thus described the disclosure in general terms, reference will now be made to the accompanying drawings, which are not necessarily drawn to scale, and wherein:

DETAILED DESCRIPTION

Example embodiments will now be described more fully hereinafter with reference to the accompanying drawings, in which some, but not all, embodiments are shown. Indeed, the embodiments may take many different forms and should not be construed as limited to the embodiments set forth herein; rather, these embodiments are provided so that this disclosure will satisfy applicable legal requirements. Like reference numerals refer to like elements throughout. The terms "exemplary" and "example" as may be used herein are not provided to convey any qualitative assessment, but instead merely to convey an illustration of an example. Thus, use of any such terms should not be taken to limit the spirit and scope of embodiments of the present invention.

A ball grid array is a type of electrical connection for an integrated circuit that is mounted on a surface (e.g., a substrate) of the integrated circuit. Solder balls of a ball grid array are generally arranged in a grid-shape on a bottom surface of an integrated circuit. For example, with a traditional ball grid array, ground solder balls are arranged in parallel rows and columns between pairs of solder balls associated with communication channel connections. However, traditional ball grid arrays arranged in a grid-shape are generally prone to interference between solder balls, inefficient performance for communication channel connections associated with the ball grid array, and/or inefficient power consumption for an integrated circuit associated with the ball grid array.

In an embodiment related to high-speed communication systems (e.g., datacenter servers), a ball grid array can be employed to connect an integrated circuit of a switch (e.g., a network switch, an optical switch, etc.) to a carrier circuit board. Furthermore, the ball grid array can provide contacts for transmitted channel signals, received channel signals, power and/or auxiliary connections such as, for example, Peripheral Component Interphase Express (PCIE) connections. However, the arrangement of solder balls in a traditional ball grid array employed to connect an integrated circuit of a switch to a carrier circuit board generally results in interference and/or crosstalk between one or more signals transmitted via the ball grid array.

Thus, to address these and/or other issues, an improved ball grid array for an integrated circuit (e.g., an integrated circuit of a switch) is disclosed herein. In one or more embodiments disclosed herein, a ball grid array pattern for a ball grid array provides effective differential interference cancellation between one or more signals transmitted via the ball grid array is provided. In one or more embodiments, a ball grid array pattern disclosed herein is an arrangement of solder balls connecting an integrated circuit (e.g., a switch or another type of network-connected integrated circuit) to a carrier circuit board in order to provide an optimal ball grid array package for the integrated circuit. According to various embodiments of the ball grid array pattern disclosed herein, performance of communication channels (e.g., high-speed communication channels) of an integrated circuit and/or power management for an integrated circuit is improved as compared to a traditional integrated circuit that employs a traditional ball grid array. As such, in one or more embodiments, improved performance and/or improved efficiency of an integrated circuit is provided. For example, in one or more embodiments, an integrated circuit with improved electrical connections, improved signal integrity, reduced crosstalk between signals, improved direct current (DC) power integrity and/or improved alternating current (AC) power integrity are provided. Additionally, in one or more embodiments, the ball grid array pattern disclosed herein facilitates reduced cost for an integrated circuit and/or a switch package by reducing the number of printed circuit board layers and/or by increasing ball grid array density.

Figure 1:
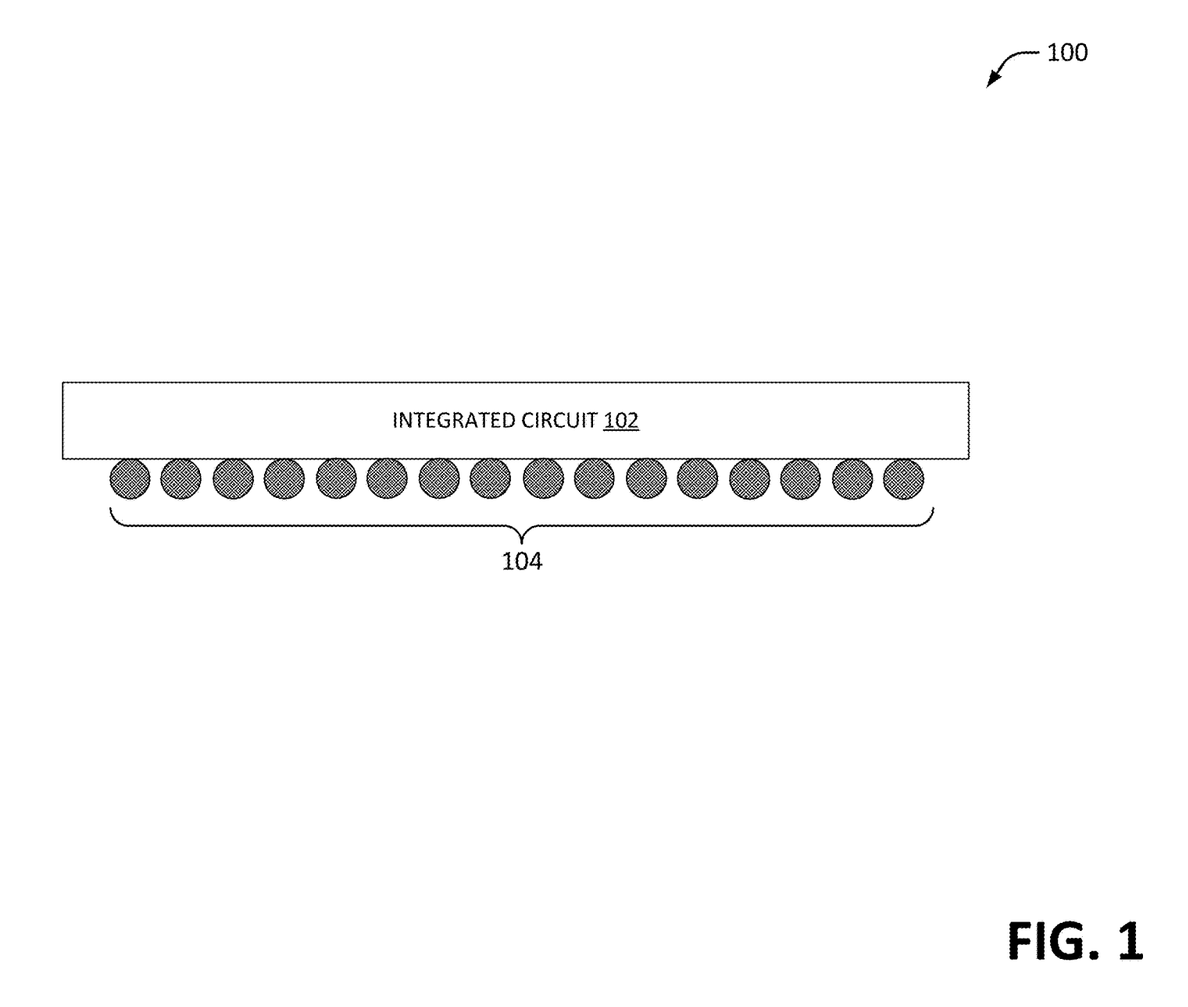
FIG. 1 illustrates an example system associated with an integrated circuit comprising a ball grid array, in accordance with one or more embodiments of the present disclosure.

FIG. 1 illustrates a system 100 that provides an integrated circuit with a ball grid array according to one or more embodiments of the present disclosure. In one or more embodiments, the system 100 is a switch integrated circuit packaging system. The system 100 includes an integrated circuit 102. The integrated circuit 102 can be, for example, an integrated circuit of a switch. For example, the integrated circuit 102 can be an integrated circuit of a network switch, an optical switch, or another type of switch. In one example, the integrated circuit can be an Ethernet switch application-specific integrated circuit. However, it is to be appreciated that, in certain embodiments, the integrated circuit 102 can be a different type of integrated circuit for another type of technical application associated with a ball grid array. For instance, in one or more embodiments, the system 100 can be an integrated circuit packaging system for a network adaptor. In an example, the integrated circuit 102 can be associated with a network adaptor. Alternatively, in one or more embodiments, the system 100 can be an integrated circuit packaging system for a graphics processing unit (GPU). For example, the integrated circuit 102 can be associated with and/or configured as a GPU.

The integrated circuit 102 comprises a ball grid array 104. For instance, in one or more embodiments, the ball grid array 104 is disposed on the integrated circuit 102 to facilitate electrical connections for the integrated circuit 102. The ball grid array 104 can be configured in a ball grid array pattern to provide interference cancellation (e.g., crosstalk reduction) between electrical signals transmitted via the ball grid array 104. In an embodiment, the ball grid array 104 can be disposed on the integrated circuit 102 via a fluxing ball grid array assembly technique associated with flux adhesive, a solder paste ball grid array assembly technique associated with solder paste, and/or another type of ball grid array assembly technique associated with an adhesive. For example, in an embodiment, solder balls of the ball grid array 104 can be placed onto respective adhesive deposits (e.g., flux deposits, solder paste deposits, etc.) applied to the integrated circuit 102. However, it is to be appreciated that, in certain embodiments, another type of ball grid array assembly technique can be employed to dispose the ball grid array 104 onto the integrated circuit 102.

Figure 2:
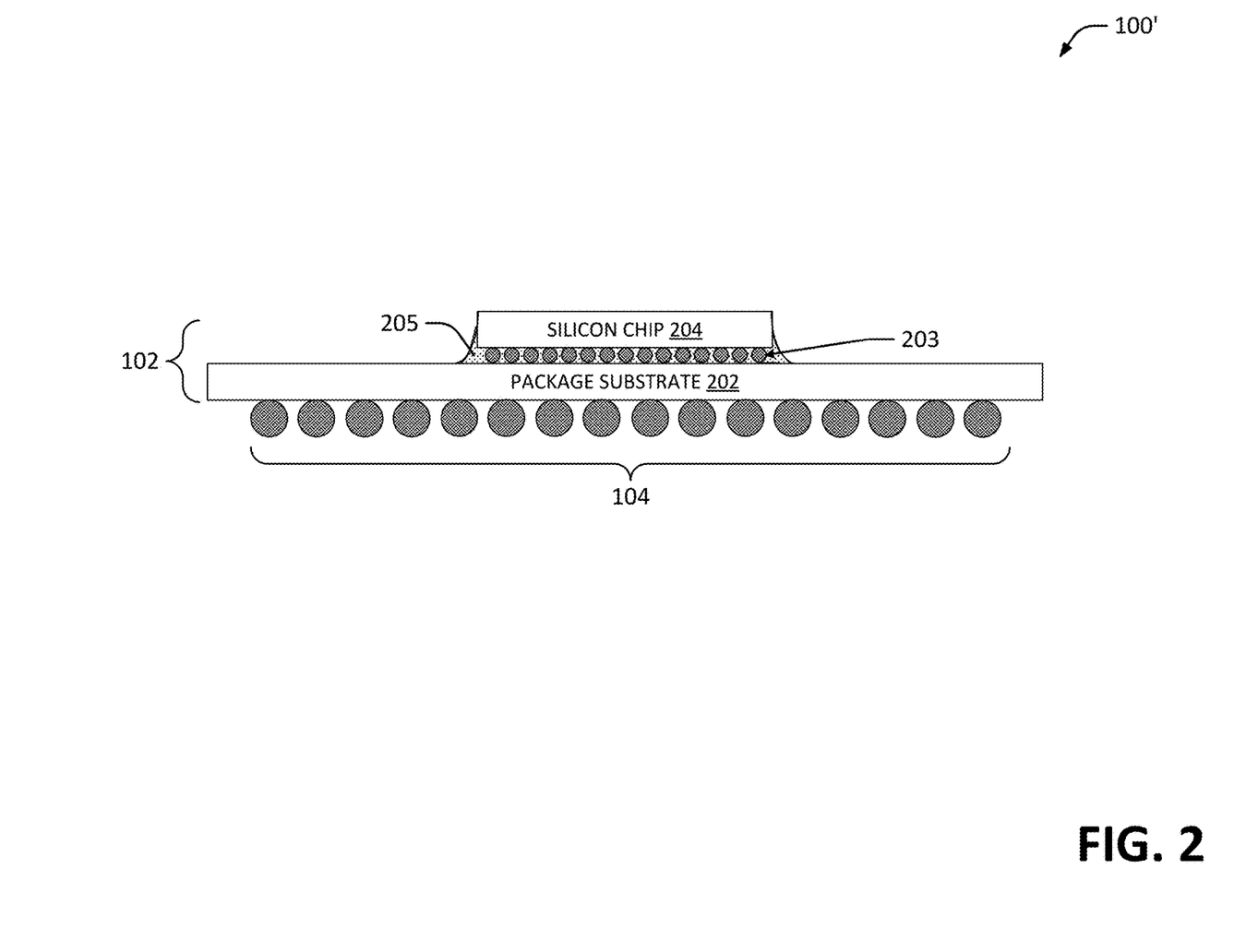
FIG. 2 illustrates another example system associated with an integrated circuit comprising a ball grid array, in accordance with one or more embodiments of the present disclosure.

FIG. 2 illustrates a system 100' that provides an integrated circuit with a ball grid array according to one or more embodiments of the present disclosure. In one or more embodiments, the system 100' is an alternate embodiment of the system 100. The system 100' includes the integrated circuit 102 and the ball grid array 104. Furthermore, in an embodiment, the integrated circuit 102 includes a package substrate 202 and a silicon chip 204. The silicon chip 204 can be configured for network communications (e.g., optical communications, Ethernet, InfiniBand, etc.), Ethernet switching, internet protocol (IP) switching, transmitter communications, receiver communications, cloud computing, high-performance computing, machine learning, data storage, enterprise data centers, network security, network detection and response, network power distribution, and/or one or more technologies. Additionally, the silicon chip 204 may comprise one or more processing units for the integrated circuit 102 such as, for example, one or more integrated circuit processor cores, one or more integrated circuit dies, one or more data processing units, one or more processors, one or more central processing units, one or more microprocessors, and/or one or more other processing units. In one or more embodiments, the silicon chip 204 can be configured for one or more switch integrated circuit applications (e.g., one or more high speed switch integrated circuit applications) to provide a greater number of serial signals (e.g., high-speed serial signals) to be transmitted with improved signal integrity.

In one or more embodiments, the ball grid array 104 can be disposed on the package substrate 202 of the integrated circuit 102 to facilitate electrical connections for the silicon chip 204 of the integrated circuit 102. In one or more embodiments, the ball grid array 104 can be disposed on the package substrate 202 of the integrated circuit 102 to facilitate electrical connections for communication channels associated with the silicon chip 204. For example, the ball grid array 104 can be disposed on the package substrate 202 of the integrated circuit 102 to facilitate electrical connections for transmitter communication channels (e.g., transmitter-side of communication channels) associated with the silicon chip 204 and/or receiver communication channels (e.g., receiver-side of communication channels) associated with the silicon chip 204. Additionally or alternatively, the ball grid array 104 can be disposed on the package substrate 202 of the integrated circuit 102 to facilitate electrical connections for the electrical ground for the silicon chip 204. Additionally or alternatively, the ball grid array 104 can be disposed on the package substrate 202 of the integrated circuit 102 to facilitate electrical connections for the power supply associated with the silicon chip 204. Additionally or alternatively, the ball grid array 104 can be disposed on the package substrate 202 of the integrated circuit 102 to facilitate electrical connections for auxiliary signals (e.g., PCIE connections) associated with the silicon chip 204. In certain embodiments, the package substrate 202 can include one or more vias (e.g., one or more via electrical connections, one or more through-silicon vias, one or more microvias, etc.) to facilitate one or more electrical connections between the ball grid array 104 and the silicon chip 204. Additionally or alternatively, the package substrate 202 can include one or more electrical traces on one or more surfaces of the package substrate 202 to facilitate one or more electrical connections between the ball grid array 104 and the silicon chip 204.

In an embodiment, the ball grid array 104 can be disposed on the package substrate 202 via a fluxing ball grid array assembly technique associated with flux adhesive, a solder paste ball grid array assembly technique associated with solder paste, and/or another type of ball grid array assembly technique associated with an adhesive. For example, in an embodiment, solder balls of the ball grid array 104 can be placed onto respective adhesive deposits (e.g., flux deposits, solder paste deposits, etc.) applied to the package substrate 202.

In certain embodiments, the silicon chip 204 can be mounted on the package substrate 202 via a first-level interconnect (FLI) 203 that mechanically and/or electrically connects the silicon chip 204 to the package substrate 202. In one or more embodiments, the FLI 203 can be a flip-chip FLI. In an embodiment, the FLI 203 can include a set of solder balls that provide an interconnection between a set of metal contacts on the silicon chip 204 and a set of metal contacts on the package substrate 202. In an embodiment, the FLI 203 can be disposed on the package substrate 202 and/or the silicon chip 204 via a flux adhesive, solder paste, and/or another type of adhesive. For example, in an embodiment, solder balls of the FLI 203 can be placed onto respective adhesive deposits (e.g., flux deposits, solder paste deposits, etc.) applied to the package substrate 202 and/or the silicon chip 204. In certain embodiments, the integrated circuit 102 can additionally include an underfill portion 205 configured to distribute thermal expansion differences between the silicon chip 204 and the package substrate 202. In one or more embodiments, the underfill portion 205 includes an epoxy polymer that fills one or more spaces between the silicon chip 204 and the package substrate 202.

Figure 3:
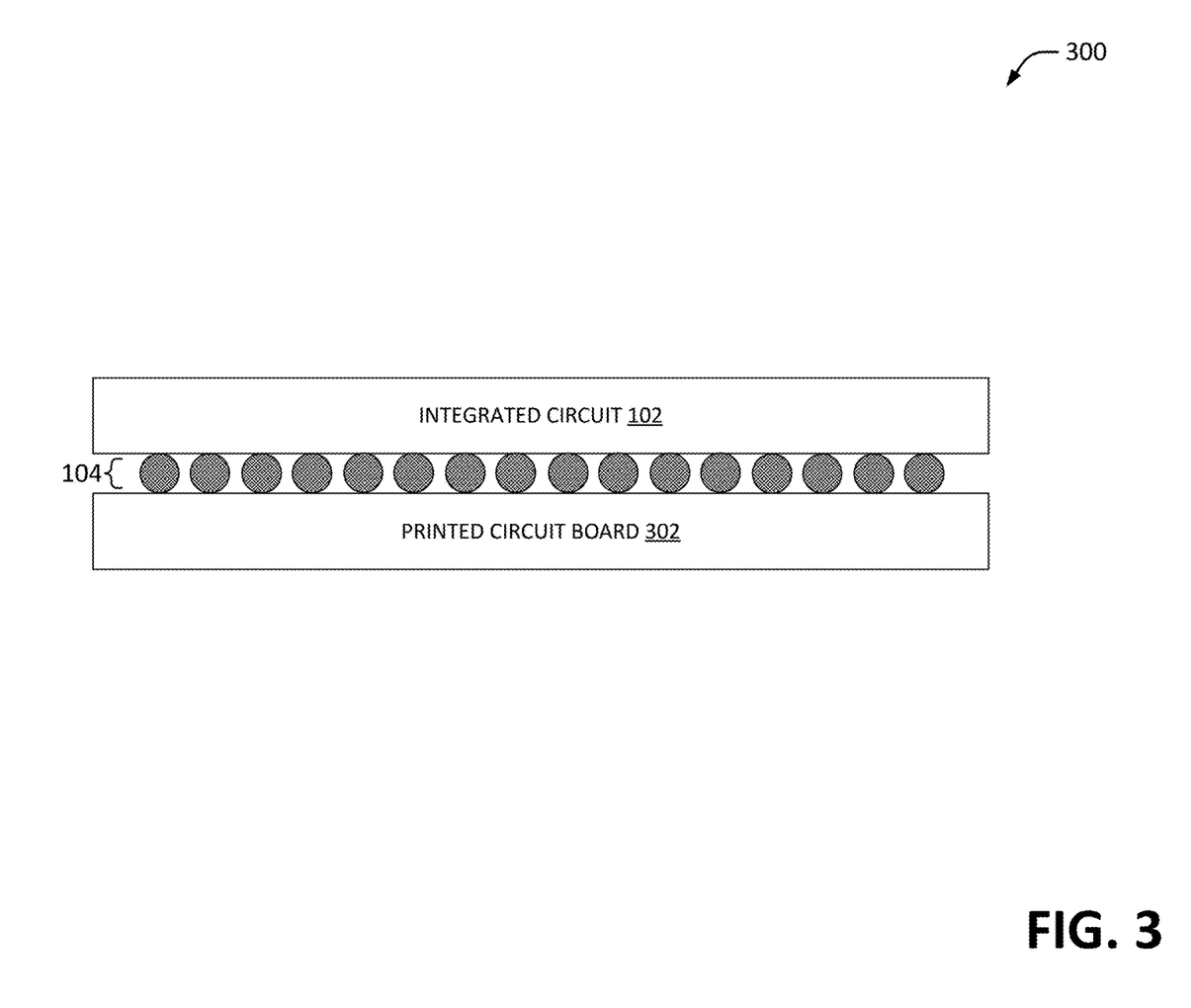
FIG. 3 illustrates an example integrated circuit package system, in accordance with one or more embodiments of the present disclosure.

FIG. 3 illustrates a system 300 that provides an integrated circuit package system according to one or more embodiments of the present disclosure. In one or more embodiments, the system 300 can be an integrated circuit package system. The system 300 includes the integrated circuit 102, the ball grid array 104 and a printed circuit board 302. In certain embodiments, the integrated circuit 102 includes the package substrate 202 and the silicon chip 204. In an embodiment, the integrated circuit 102 can be attached to the printed circuit board 302 via the ball grid array 104. For example, the ball grid array 104 can be disposed between the integrated circuit 102 (e.g., the package substrate 202 of the integrated circuit 102) and the printed circuit board 302. In an aspect, the ball grid array 104 can provide one or more electrical connections between the integrated circuit 102 and the printed circuit board 302. In certain embodiments, the printed circuit board 302 can be a carrier circuit board for the integrated circuit 102. For example, the printed circuit board 302 can be a network switch circuit board and/or a network router circuit board (e.g., an Ethernet switch circuit board and/or an Ethernet router circuit board). In another example, the printed circuit board 302 can be a network adaptor circuit board. In another embodiment, the printed circuit board 302 can be a transceiver circuit board. In another example, the printed circuit board 302 can be a printed circuit board for a network adaptor. In another example, the printed circuit board 302 can be a printed circuit board for a GPU. However, it is to be appreciated that, in certain embodiments, the printed circuit board 302 can be a different type of printed circuit board. In one or more embodiments, the printed circuit board 302 can receive one or more electrical signals from the integrated circuit 102 (e.g., from the silicon chip 204) via the ball grid array 104. Additionally or alternatively, in one or more embodiments, the printed circuit board 302 can send one or more electrical signals to the integrated circuit 102 (e.g., to the silicon chip 204) via the ball grid array 104. The one or more electrical signals transmitted between the integrated circuit 102 and the printed circuit board 302 via the ball grid array 104 can include one or more electrical signals associated with communication channels, one or more electrical signals associated with transmitter communication channels (e.g., transmitter-side of communication channels), one or more electrical signals associated with receiver communication channels (e.g., receiver-side of communication channels), one or more electrical signals associated with auxiliary connections (e.g., PCIE connections), one or more electrical signals associated with data, and/or one or more other electrical signals. In one or more embodiments, one or more modulated data signals can be transmitted between the integrated circuit 102 and the printed circuit board 302 via one or more communication channels associated with the ball grid array 104. For example, in an embodiment, one or more pulse amplitude modulation (PAM) data signals (e.g., one or more PAM2 data signals, one or more PAM4 data signals, etc.) can be transmitted between the integrated circuit 102 and the printed circuit board 302 via one or more communication channels associated with the ball grid array 104. It is also to be appreciated that, in certain embodiments, one or more other types of modulation data signals can alternatively be transmitted between the integrated circuit 102 and the printed circuit board 302 via one or more communication channels associated with the ball grid array 104.

Figure 4:
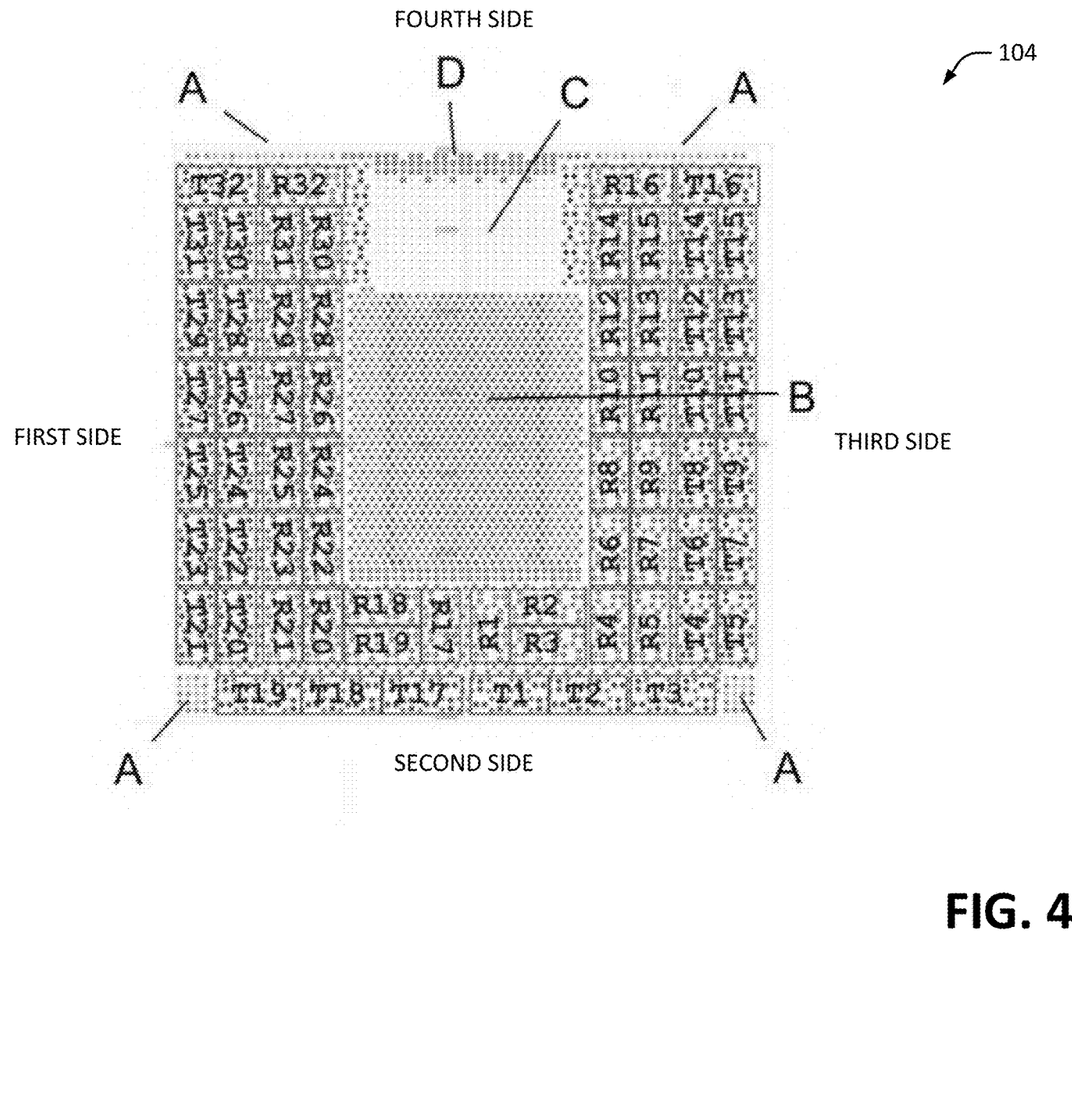
FIG. 4 illustrates an example ball grid array, in accordance with one or more embodiments of the present disclosure.

FIG. 4 illustrates an example embodiment of the ball grid array 104 according to one or more embodiments of the present disclosure. For example, a layout of solder balls for the ball grid array 104 can be configured according to the embodiment illustrated in FIG. 4. Thus, in one or more embodiments, the ball grid array 104 can be disposed on the integrated circuit 102 (e.g., the package substrate 202 of the integrated circuit 102) according to the configuration shown in FIG. 4. In one or more embodiments, the integrated circuit 102 (e.g., the package substrate 202 of the integrated circuit 102) defines a first side (e.g., FIRST SIDE shown in FIG. 4), a second side (e.g., SECOND SIDE shown in FIG. 4), a third side (e.g., THIRD SIDE shown in FIG. 4), and a fourth side (e.g., FOURTH SIDE shown in FIG. 4). In an embodiment, a set of solder balls of the ball grid array 104 can be arranged along the first side, the second side, and the third side. Furthermore, another set of solder balls of the ball grid array 104 that is different than the set of solder balls arranged along the first side, the second side, and the third side can be arranged along the fourth side.

In an embodiment, solder balls for high-speed channels populate three outer sides of a surface of the integrated circuit 102 (e.g., a surface of the package substrate 202 of the integrated circuit 102). Furthermore, solder balls for power supply and/or auxiliary signals may populate a fourth side of the surface of the integrated circuit 102 (e.g., a surface of the package substrate 202 of the integrated circuit 102). As illustrated in FIG. 4, areas marked as "T" and "R" of the ball grid array 104, respectively, contain solder balls for connecting different signal pairs of transmitter communication channels (e.g., transmitter-side of communication channels) and receiver communication channels (e.g., receiver-side of communication channels). However, it is to be appreciated that the locations of the T and R pairs can be interchanged. Furthermore, the areas marked as "A" of the ball grid array 104 can contain solder balls that correspond to auxiliary signals, the area marked as "B" of the ball grid array 104 can contain solder balls that correspond to power supply signals, and the area marked as "C" of the ball grid array 104 can contain solder balls that correspond to a different type of electrical connection. In certain embodiment, the area marked "D" of the ball grid array 104 can include solder balls that correspond to one or more electrical connections for a component layer of the printed circuit board 302. In certain embodiments, since solder balls for the power supply are located approximately in a middle portion of the ball grid array 104, the area "D" can be implemented without vias, thereby improving performance of the integrated circuit 102.

Figure 5:
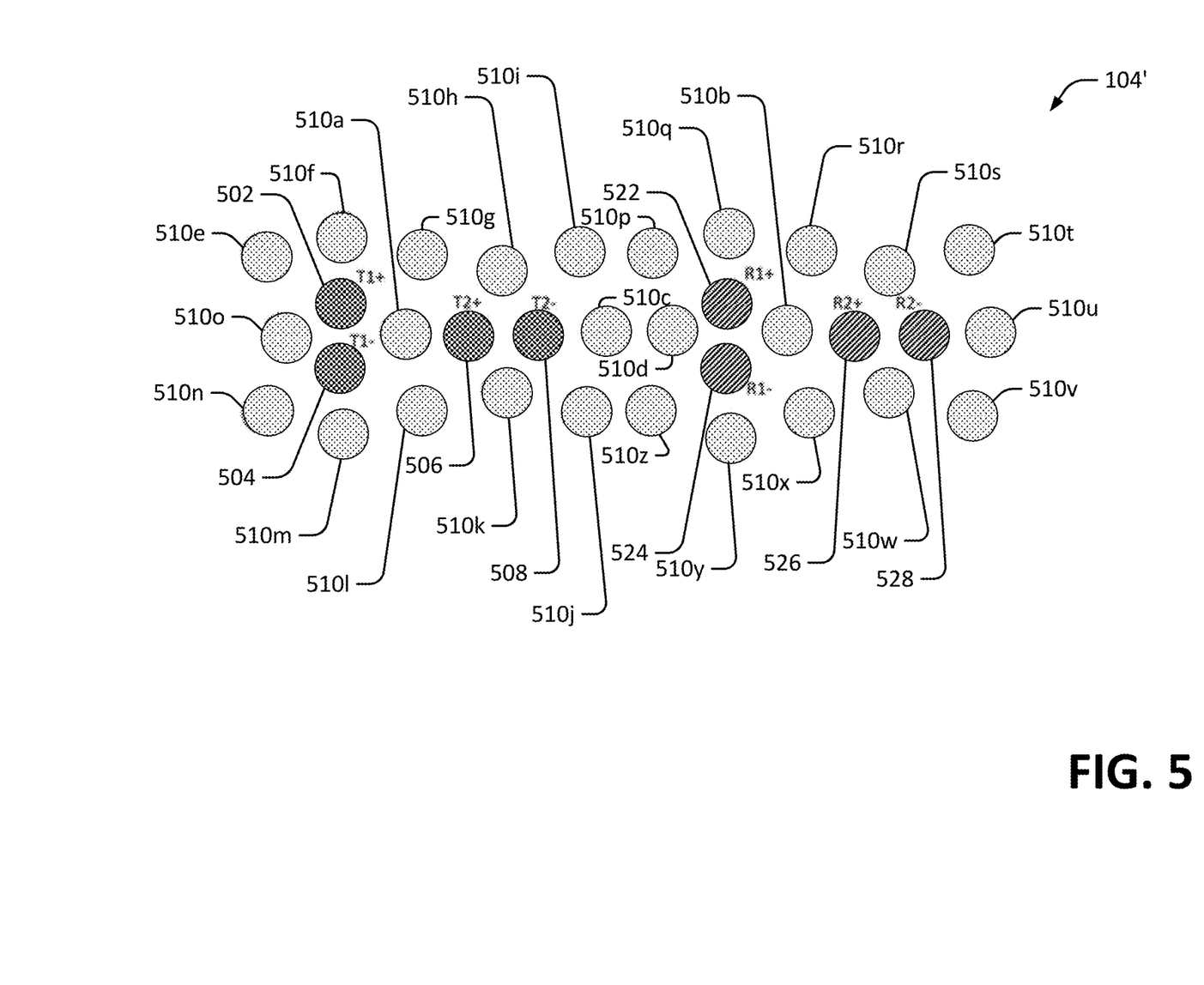
FIG. 5 illustrates another example ball grid array in accordance with one or more embodiments of the present disclosure.

FIG. 5 illustrates an example ball grid array 104' according to one or more embodiments of the present disclosure. The ball grid array 104' can correspond to at least a portion of the ball grid array 104. In an embodiment, the ball grid array 104' can illustrate an interference cancellation pattern associated with at least a portion of the ball grid array 104. For example, solder balls assigned to the communication channels can be arranged in an interference-canceling pattern, thus improving performance of the communication channels and/or the integrated circuit 102. In one or more embodiments, the ball grid array 104' includes a solder ball 502 associated with a communication channel such as a transmitter communication channel T1+, a solder ball 504 associated with a communication channel such as a transmitter communication channel T1−, a solder ball 506 associated with a communication channel such as a transmitter communication channel T2+, and a solder ball 508 associated with a communication channel such as a transmitter communication channel T2−. For example, the solder ball 502 associated with T1+ and the solder ball 504 associated with T1− can be differential pairs allocated to communication channels associated with a transmitter. Furthermore, the solder ball 506 associated with T2+ and the solder ball 508 associated with T2− can additionally or alternatively be differential pairs allocated to communication channels associated with a transmitter. Additionally or alternatively, in one more embodiments, the ball grid array 104' includes a solder ball 522 associated with a communication channel such as a receiver communication channel R1+, a solder ball 524 associated with a communication channel such as a receiver communication channel R1−, a solder ball 526 associated with a communication channel such as a receiver communication channel R2+, and a solder ball 528 associated with a communication channel such as a receiver communication channel R2−. For example, the solder ball 522 associated with R1+ and the solder ball 524 associated with R1− can be differential pairs allocated to communication channels associated with a receiver. Furthermore, the solder ball 526 associated with R2+ and the solder ball 528 associated with R2− can additionally or alternatively be differential pairs allocated to communication channels associated with a receiver. The ball grid array 104' may also include a set of solder balls associated with electrical ground such as solder balls 510a-z.

In one or more embodiments as illustrated in FIG. 5, a first set of solder balls (e.g., solder ball 502, solder ball 504, solder ball 506, solder ball 508, solder ball 522, solder ball 524, solder ball 526, and/or solder ball 528) of the ball grid array 104' is configured to provide electrical connections for communication channels associated with the silicon chip 204. Furthermore, a second set of the solder balls (e.g., one or more solder balls from the solder balls 510a-z) of the ball grid array 104' is associated with an electrical ground and/or electric power for the silicon chip 204. In certain embodiments, the first set of solder balls is surrounded by one or more solder balls (e.g., one or more solder balls from the solder balls 510e-z) from the second set of the solder balls.

In an embodiment, the first set of solder balls comprises a first subset of solder balls (e.g., solder ball 502 and solder ball 504) configured in a first orientation (e.g., a vertical direction orientation) and a second subset of solder balls (e.g., solder ball 506 and solder ball 508) configured in a second orientation (e.g., a horizontal direction orientation) that is different than the first orientation. In an embodiment, the second orientation associated with the second subset of solder balls (e.g., solder ball 506 and solder ball 508) can be perpendicular or approximately perpendicular with respect to the first orientation associated with the first subset of solder balls (e.g., solder ball 502 and solder ball 504). For instance, in an embodiment, the first subset of solder balls (e.g., solder ball 502 and solder ball 504) can be positioned on the package substrate 202 substantially along a first axis and the second subset of solder balls (e.g., solder ball 506 and solder ball 508) can be positioned on the package substrate 202 substantially along a second axis, where the first axis and the second axis are configured in different orientation with respect to the package substrate 202 (e.g., where the second axis is perpendicular or approximately perpendicular with respect to the first axis). Additionally, at least one solder ball (e.g., solder ball 510a) from the second set of solder balls is disposed between the first subset of solder balls (e.g., solder ball 502 and solder ball 504) and the second subset of solder balls (e.g., solder ball 506 and solder ball 508).

In another embodiment, the first set of solder balls comprises a third subset of solder balls (e.g., solder ball 522 and solder ball 524) configured in the first orientation (e.g., the vertical direction orientation) and a fourth subset of solder balls (e.g., solder ball 526 and solder ball 528) configured in the second orientation (e.g., the horizontal direction orientation). Furthermore, at least one other solder ball (e.g., solder ball 510b) from the second set of solder balls is disposed between the third subset of solder balls (e.g., solder ball 522 and solder ball 524) and the fourth subset of solder balls (e.g., solder ball 526 and solder ball 528). In an embodiment, the second orientation associated with the fourth subset of solder balls (e.g., solder ball 526 and solder ball 528) can be perpendicular or approximately perpendicular with respect to the first orientation associated with the third subset of solder balls (e.g., solder ball 522 and solder ball 524). For instance, in an embodiment, the third subset of solder balls (e.g., solder ball 522 and solder ball 524) can be positioned on the package substrate 202 substantially along a third axis and the fourth subset of solder balls (e.g., solder ball 526 and solder ball 528) can be positioned on the package substrate 202 substantially along the second axis, where the second axis and the third axis are configured in different orientation with respect to the package substrate 202 (e.g., where the second axis is perpendicular or approximately perpendicular with respect to the third axis). In one or more embodiments, the second subset of solder balls (e.g., solder ball 506 and solder ball 508) and the fourth subset of solder balls (e.g., solder ball 526 and solder ball 528) can be positioned on the package substrate 202 substantially along the same axis (e.g., the second axis). Furthermore, in one or more embodiments, an axis (e.g., the first axis) associated with the first subset of solder balls (e.g., solder ball 502 and solder ball 504) can be substantially parallel to an axis (e.g., the third axis) associated with the third subset of solder balls (e.g., solder ball 522 and solder ball 524). Additionally, in certain embodiments, at least one other solder ball (e.g., solder ball 510c and/or solder ball 510d) from the second set of solder balls is disposed between the second subset of solder balls (e.g., solder ball 506 and solder ball 508) and the third subset of solder balls (e.g., solder ball 522 and solder ball 524).

In certain embodiments, the first subset of solder balls (e.g., solder ball 502 and solder ball 504) and the second subset of solder balls (e.g., solder ball 506 and solder ball 508) can be associated with transmitter communication channels, and the third subset of solder balls (e.g., solder ball 522 and solder ball 524) and the fourth subset of solder balls (e.g., solder ball 526 and solder ball 528) can be associated with receiver communication channels. Alternatively, in certain embodiments, the first subset of solder balls (e.g., solder ball 502 and solder ball 504) and the second subset of solder balls (e.g., solder ball 506 and solder ball 508) can be associated with receiver communication channels, and the third subset of solder balls (e.g., solder ball 522 and solder ball 524) and the fourth subset of solder balls (e.g., solder ball 526 and solder ball 528) can be associated with transmitter communication channels. In certain embodiments, the first subset of solder balls (e.g., solder ball 502 and solder ball 504) and the second subset of solder balls (e.g., solder ball 506 and solder ball 508) are surrounded by a one or more solder balls (e.g., solder balls 510e-o) from the second set of the solder balls. Additionally or alternatively, the third subset of solder balls (e.g., solder ball 522 and solder ball 524) and the fourth subset of solder balls (e.g., solder ball 526 and solder ball 528) are surrounded by one or more solder balls (e.g., solder balls 510p-z) from the second set of solder balls.

In certain embodiments, a third set of solder balls can be configured to provide second electrical connections for a power supply and/or auxiliary signals associated with the silicon chip 204. In certain embodiments, the package substrate 202 defines a first side, a second side, a third side, and a fourth side. The first set of solder balls can be arranged along the first side, the second side, and the third side of the substrate. Furthermore, the third set of solder balls can be arranged along the fourth side of the package substrate 202.

Figure 6:
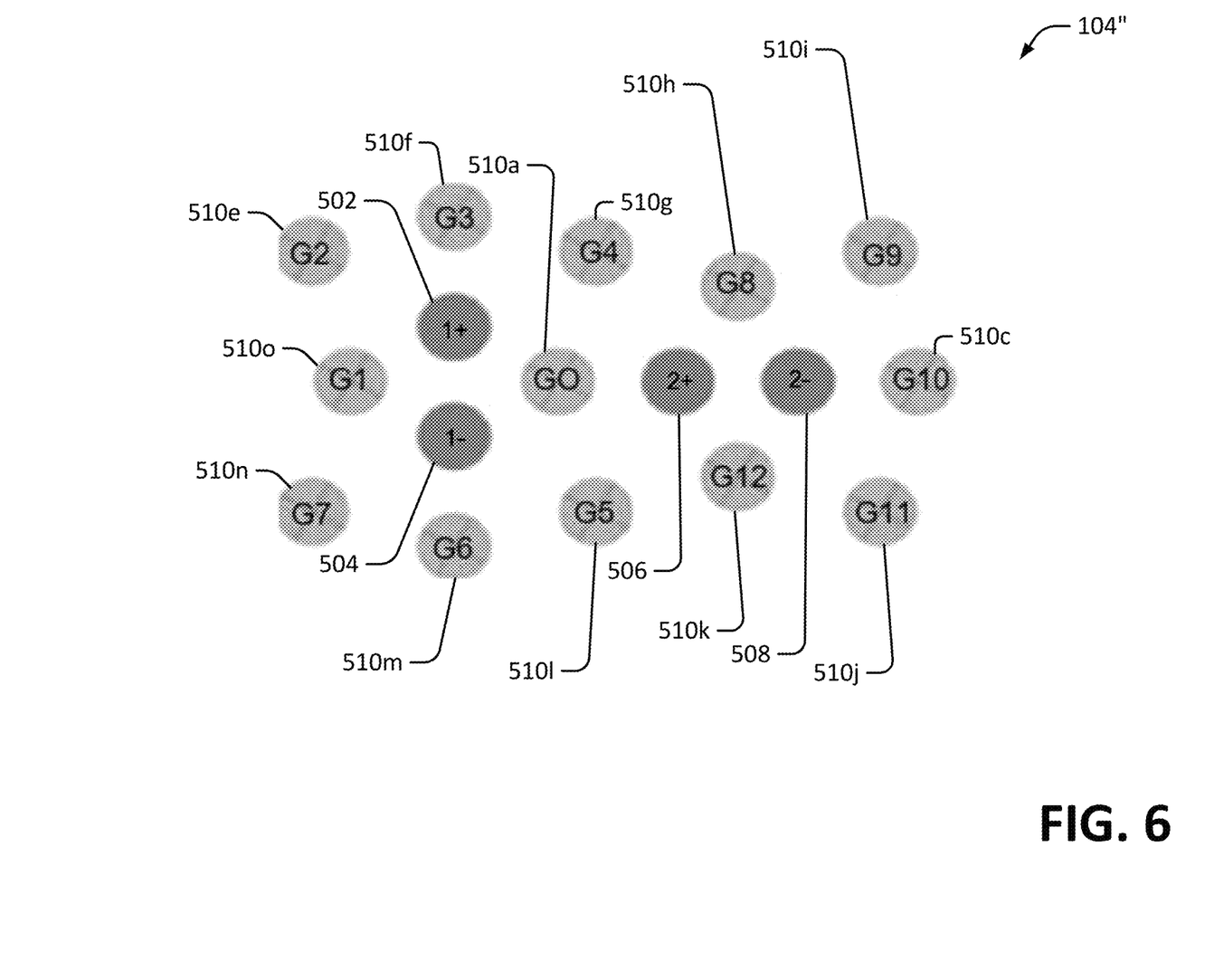
FIG. 6 illustrates another example ball grid array in accordance with one or more embodiments of the present disclosure.

FIG. 6 illustrates an example ball grid array 104" according to one or more embodiments of the present disclosure. The ball grid array 104" can correspond to at least a portion of the ball grid array 104 and/or the ball grid array 104'. In an embodiment, the ball grid array 104" is arranged in an interference cancellation pattern associated with at least a portion of the ball grid array 104 and/or the ball grid array 104'. For example, solder balls assigned to the communication channels can be arranged in an interference-canceling pattern for signals associated with the solder balls, thus improving performance of the communication channels and/or the integrated circuit 102. In one or more embodiments, the ball grid array 104" includes the solder ball 502, the solder ball 504, the solder ball 506, the solder ball 508, the solder ball 510a, the solder ball 510c, the solder ball 510e, the solder ball 510f, the solder ball 510g, the solder ball 510h, the solder ball 510i, the solder ball 510j, the solder ball 510k, the solder ball 510l, the solder ball 510m, the solder ball 510n, and the solder ball 510o.

In an embodiment, solder ball 510a (e.g., G0) together with solder ball 506 (e.g., 2+) and solder ball 508 (e.g., 2−) form a long leg of a "T" shaped configuration and solder ball 502 (e.g., 1+) and solder ball 504 (e.g., 1−) form the crossbar of the "T". In certain embodiments, solder ball 502 and solder ball 504 can be surrounded by eight solder balls (e.g., solder ball 510a, solder balls 510e-g and solder balls 510l-n that corresponds to G0-G7) associated with electrical ground. In certain embodiments, solder ball 506 and solder ball 508 can also be surrounded by eight solder balls (e.g., solder ball 510a and solder balls 510g-l that corresponds to G0, G4, G5 and G8-G12) associated with electrical ground. In an aspect, the T-shaped configuration can provide differential interference cancellation for the ball grid array 104". In another aspect, solder ball 510a, solder ball 510c, solder ball 510e, solder ball 510f, solder ball 510g, solder ball 510h, solder ball 510i, solder ball 510j, solder ball 510k, solder ball 510l, solder ball 510m, solder ball 510n, and/or solder ball 510o surrounding solder ball 502, solder ball 504, solder ball 506, and/or solder ball 508 can reduce sensitivity to manufacturing imprecisions related to the integrated circuit 102. It is to be appreciated that the specific number of solder balls associated with communication channels and/or electrical ground may vary, and similar configurations can be used to achieve a similar differential interference cancellation effect.

Figure 7:
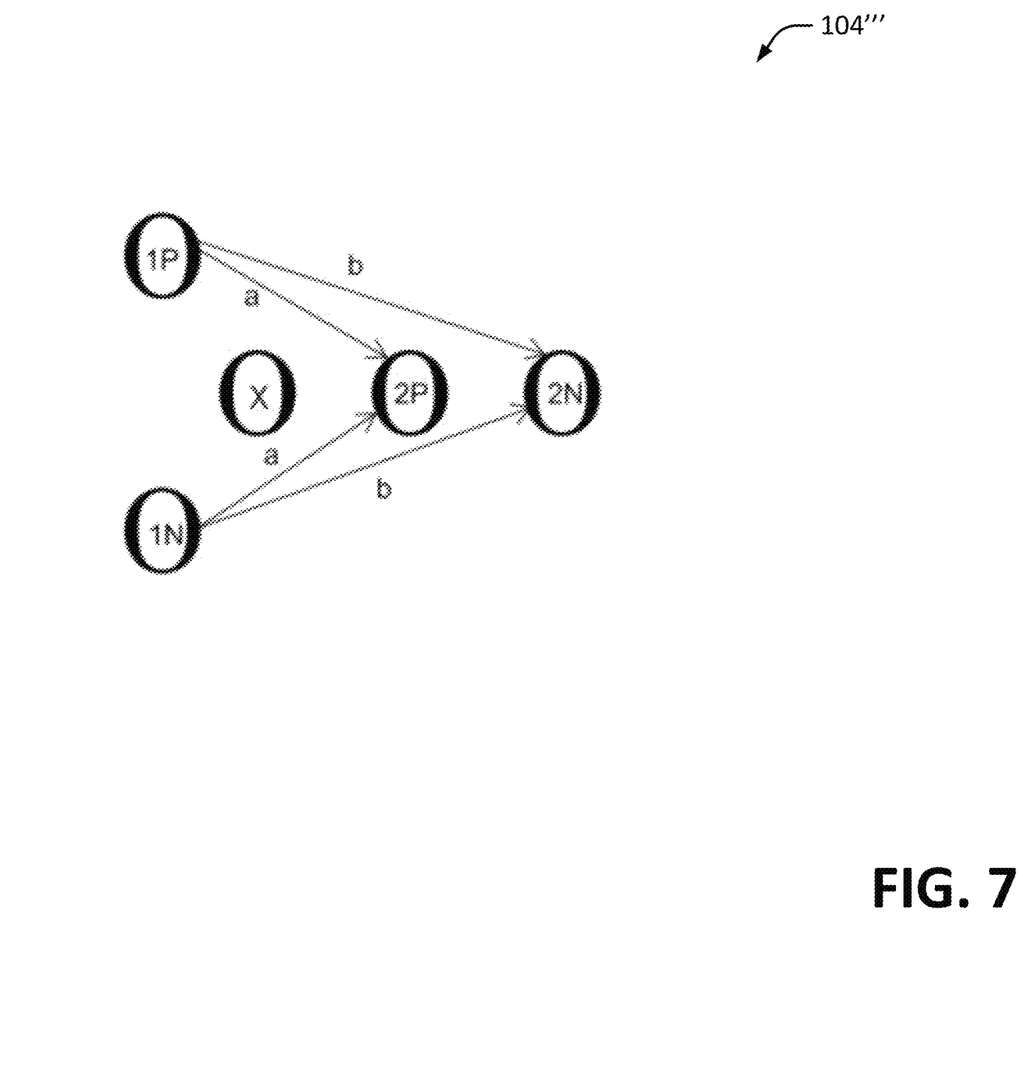
FIG. 7 illustrates another example ball grid array in accordance with one or more embodiments of the present disclosure.

FIG. 7 illustrates an example ball grid array 104''' according to one or more embodiments of the present disclosure. The ball grid array 104''' can correspond to at least a portion of the ball grid array 104, the ball grid array 104', and/or the ball grid array 104". In an embodiment, the ball grid array 104''' can illustrate an interference cancellation pattern associated with at least a portion of the ball grid array 104, the ball grid array 104', and/or the ball grid array 104". For example, the T-shaped configuration can provide differential interference cancellation, thus improving performance of the communication channels and/or the integrated circuit 102.

In an aspect, differential-to-differential coupling can depend on distances between adjacent pairs of solder balls (e.g., solder balls associated with communication channels) and can be represented by the following equation:

$$\text{coupling}=[(1P \rightarrow 2P)-(1N \rightarrow 2P)]-[(1P \rightarrow 2N)-(1N \rightarrow 2N)]$$

where numeral 1 represents a first pair of solder balls associated with communication channels, numeral 2 represents a second pairs of solder balls associated with communication channels, letter N represents a negative contact of each pair of solder balls, letter P represents a positive contact of each pair of solder balls, and the arrows → represent distance.

In FIG. 7, the letters next to the arrows represent the distances between two solder balls and the circle with an "X" in the center represents a solder ball associated with electrical ground. Placing these lengths into the equation above, it can be seen from FIG. 7 that the coupling is canceled out. For example, coupling=[(a−a)−(b−b)]=0 by employing the T-shaped configuration illustrated in FIG. 7.

Figure 8:
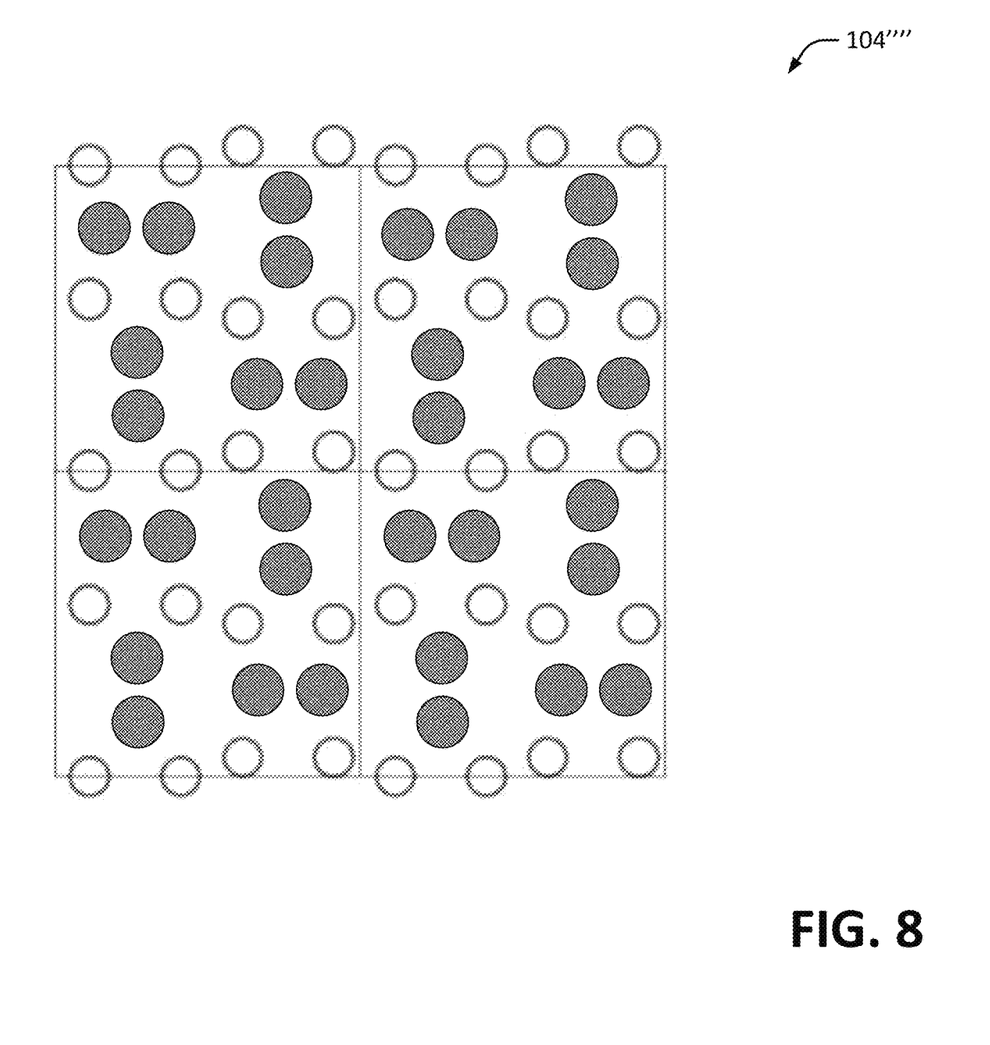
FIG. 8 illustrates another example ball grid array in accordance with one or more embodiments of the present disclosure.

FIG. 8 illustrates an example ball grid array 104"" according to one or more embodiments of the present disclosure. The ball grid array 104"" can correspond to at least a portion of the ball grid array 104. In an embodiment, the ball grid array 104"" can illustrate an interference cancellation pattern associated with at least a portion of the ball grid array 104.

In an aspect, FIG. 8 schematically compares areas for solder balls associated with signal channels and surrounding solder balls associated with electrical ground. In FIG. 8, the non-shaded circles can represent solder balls associated with electrical ground and the shaded circles can represent solder balls associated with a signal (e.g., a communication channel, power supply, an auxiliary connection, another type of signal, etc.). In another aspect, FIG. 8 can schematically show an area of the ball grid array 104 illustrated in of FIG. 4, where the area contains solder balls for 16 pairs of communication channels and corresponds to an area size of 89.6 mm2. In certain embodiments, a size of the ball grid array 104″″ can be approximately 7% smaller than traditional ball grid arrays, thereby allowing additional communication channels and/or other components to be added to the integrated circuit 102, and/or allowing a size of the package substrate 202 to be reduced.

Embodiments of the present disclosure are described below with reference to block diagrams and flowchart illustrations. Thus, it should be understood that each block of the block diagrams and flowchart illustrations may be implemented in the form of a computer program product, an entirely hardware embodiment, a combination of hardware and computer program products, and/or apparatus, systems, computing devices/entities, computing entities, and/or the like carrying out instructions, operations, steps, and similar words used interchangeably (e.g., the executable instructions, instructions for execution, program code, and/or the like) on a computer-readable storage medium for execution. For example, retrieval, loading, and execution of code may be performed sequentially such that one instruction is retrieved, loaded, and executed at a time. In some example embodiments, retrieval, loading, and/or execution may be performed in parallel such that multiple instructions are retrieved, loaded, and/or executed together. Thus, such embodiments can produce specifically-configured machines performing the steps or operations specified in the block diagrams and flowchart illustrations. Accordingly, the block diagrams and flowchart illustrations support various combinations of embodiments for performing the specified instructions, operations, or steps.

Figure 9:
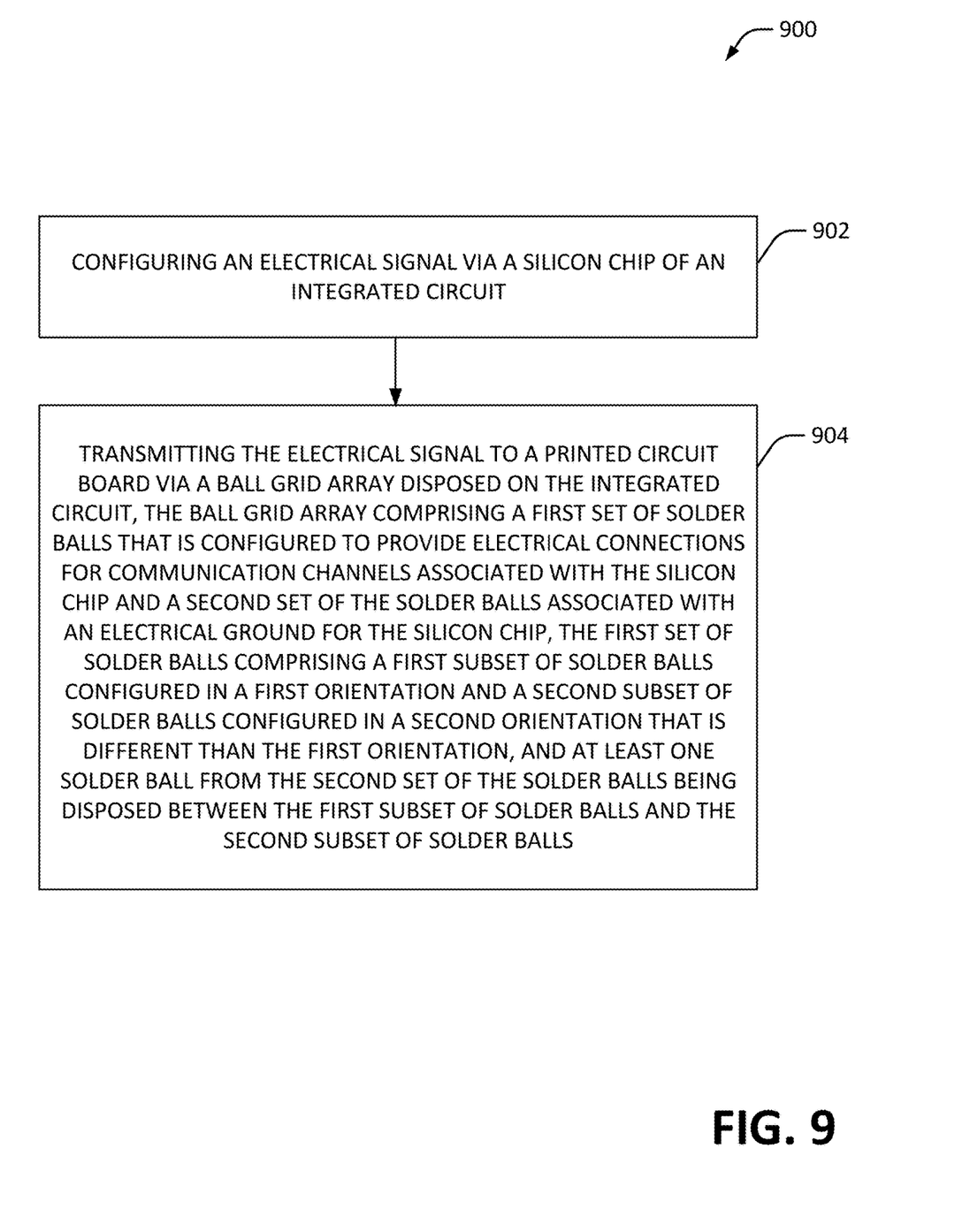
FIG. 9 is a flowchart illustrating an example method for facilitating transmission of an electrical signal via a ball grid array, in accordance with one or more embodiments of the present disclosure.

FIG. 9 is a flowchart illustrating an example method 900 for facilitating transmission of an electrical signal via a ball grid array in accordance with one or more embodiments of the present disclosure. It will be understood that each block of the flowcharts, and combinations of blocks in the flowcharts, may be implemented by various means. In some example embodiments, certain ones of the operations herein may be modified or further amplified as described below. Moreover, in some embodiments additional optional operations may also be included. It should be appreciated that each of the modifications, optional additions, or amplifications described herein may be included with the operations herein either alone or in combination with any others among the features described herein. The operations illustrated in FIG. 9 may, for example, be performed by an example computing system 1000 (shown in FIG. 10) that is embedded in an integrated circuit (e.g., the integrated circuit 102) and/or a silicon chip (e.g., the silicon chip 204). In some embodiments, the computing system 1000 is a firmware computing system embedded in an integrated circuit (e.g., the integrated circuit 102) and/or a silicon chip (e.g., the silicon chip 204). In one or more embodiments, one or more of the operations illustrated in FIG. 9 may, for example, be performed by an integrated circuit (e.g., the integrated circuit 102) and/or a silicon chip (e.g., the silicon chip 204). In one or more embodiments, at operation 902, the computing system 1000 configures an electrical signal via a silicon chip of an integrated circuit. In one or more embodiments, at operation 904, the computing system 1000 transmits the electrical signal to a printed circuit board via a ball grid array disposed on the integrated circuit, the ball grid array comprising a first set of solder balls that is configured to provide electrical connections for communication channels associated with the silicon chip and a second set of the solder balls associated with an electrical ground and/or electric power for the silicon chip, the first set of solder balls comprising a first subset of solder balls configured in a first orientation and a second subset of solder balls configured in a second orientation that is different than the first orientation, and at least one solder ball from the second set of the solder balls being disposed between the first subset of solder balls and the second subset of solder balls.

Figure 10:
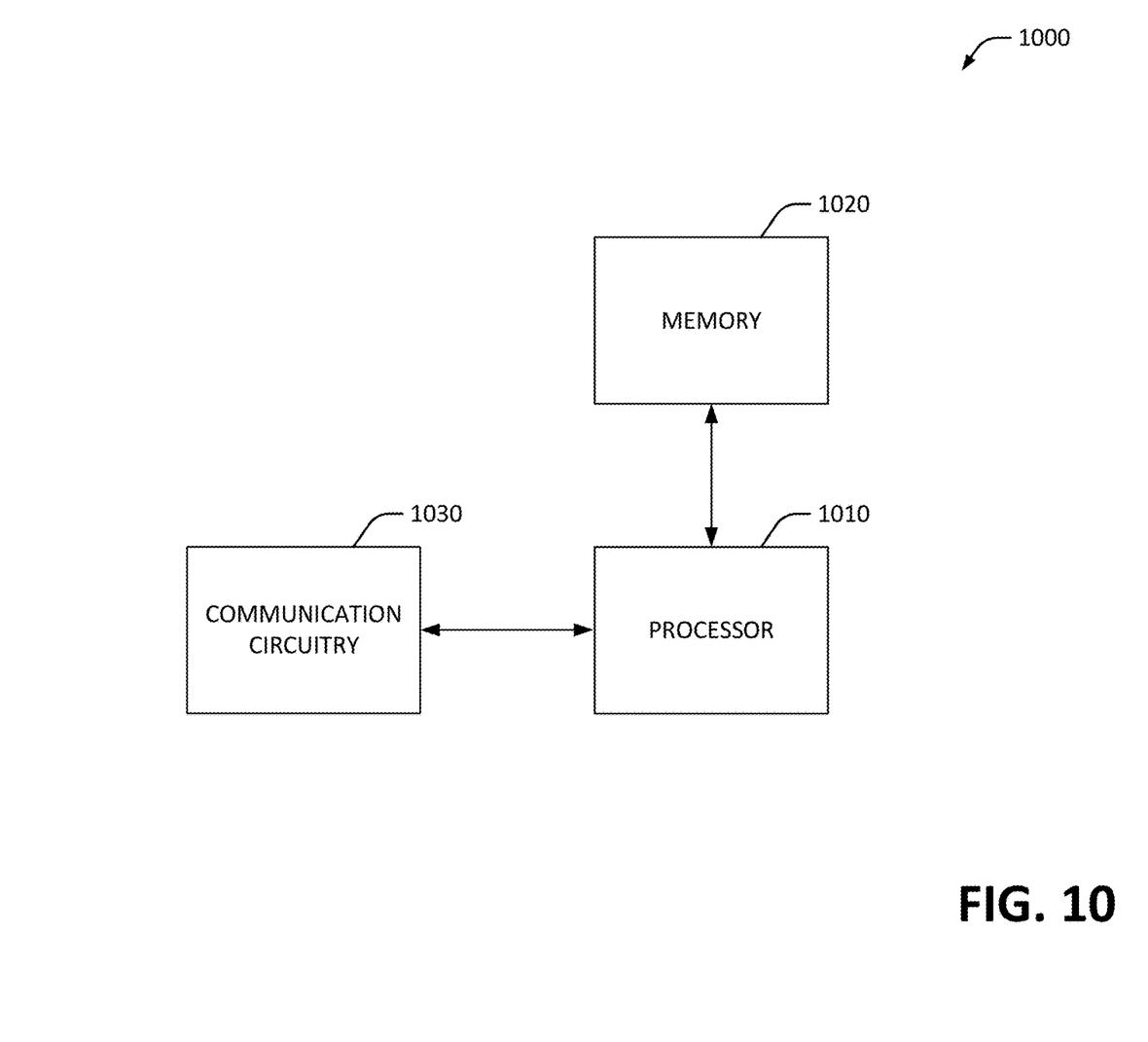
FIG. 10 illustrates an example computing system that may be embedded in an integrated circuit, in accordance with one or more embodiments of the present disclosure.

FIG. 10 illustrates the computing system 1000 that may be embedded in an integrated circuit system and/or an integrated circuit package system. In some cases, the computing system 1000 may be a firmware computing system communicatively coupled with, and configured to control, one or more circuit modules associated with an integrated circuit (e.g., the integrated circuit 102). For example, the computing system 1000 may be a firmware computing system and/or a controller computing system communicatively coupled with one or more circuit modules, such as an integrated circuit (e.g., the integrated circuit 102). The computing system 1000 may include or otherwise be in communication with a processor 1010, a memory circuitry 1020, and communication circuitry 1030. In some embodiments, the processor 1010 (which may include multiple or co-processors or any other processing circuitry associated with the processor) may be in communication with the memory circuitry 1020. The memory circuitry 1020 may comprise non-transitory memory circuitry and may include one or more volatile and/or non-volatile memories. In some examples, the memory circuitry 1020 may be an electronic storage device (e.g., a computer readable storage medium) configured to store data that may be retrievable by the processor 1010. In some examples, the data stored in the memory 1020 may include signal data, communication channel data, communication protocol data, or the like, for enabling the apparatus to carry out various functions or methods in accordance with embodiments of the present invention, described herein.

In some examples, the processor 1010 may be embodied in a number of different ways. For example, the processor may be embodied as one or more of various hardware processing means such as a silicon chip, a microprocessor, a coprocessor, a digital signal processor (DSP), a GPU, a controller, or a processing element with or without an accompanying DSP. The processor 1010 may also be embodied in various other processing circuitry including integrated circuits such as, for example, an FPGA (field programmable gate array), a microcontroller unit (MCU), an ASIC (application specific integrated circuit), a hardware accelerator, or a special-purpose electronic chip. Furthermore, in some embodiments, the processor may include one or more processing cores configured to perform independently. A multi-core processor may enable multiprocessing within a single physical package. Additionally or alternatively, the processor may include one or more processors configured in tandem via the bus to enable independent execution of instructions, pipelining, and/or multithreading. In some embodiments, the processor 1010 is a microprocessor.

In an example embodiment, the processor 1010 may be configured to execute instructions, such as computer program code or instructions, stored in the memory circuitry 1020 or otherwise accessible to the processor 1010. Alternatively or additionally, the processor 1010 may be configured to execute hard-coded functionality. As such, whether configured by hardware or software instructions, or by a combination thereof, the processor 1010 may represent a computing entity (e.g., physically embodied in circuitry) configured to perform operations according to an embodiment of the present invention described herein. For example, when the processor 1010 is embodied as an ASIC, FPGA, or similar, the processor may be configured as hardware for conducting the operations of an embodiment of the invention. Alternatively, when the processor 1010 is embodied to execute software or computer program instructions, the instructions may specifically configure the processor 1010 to perform the algorithms and/or operations described herein when the instructions are executed. However, in some cases, the processor 1010 may be a processor of a device (e.g., a mobile terminal or a fixed computing device) specifically configured to employ an embodiment of the present invention by further configuration of the processor using instructions for performing the algorithms and/or operations described herein. The processor 1010 may further include a clock, an arithmetic logic unit (ALU) and logic gates configured to support operation of the processor 1010, among other things.

The computing system 1000 may optionally also include the communication circuitry 1030. The communication circuitry may be any means embodied in either hardware or a combination of hardware and software that is configured to receive and/or transmit data from/to a network and/or any other device or module in communication with the computing system 1000. In this regard, the communication interface may include, for example, supporting hardware and/or software for enabling communications. As such, for example, the communication circuitry 1030 may include a communication modem and/or other hardware/software for supporting communication via cable, universal serial bus (USB), integrated circuit receiver, or other mechanisms.

Many modifications and other embodiments of the present inventions set forth herein will come to mind to one skilled in the art to which these inventions pertain having the benefit of the teachings presented in the foregoing descriptions and the associated drawings. Therefore, it is to be understood that the present inventions are not to be limited to the specific embodiments disclosed and that modifications and other embodiments are intended to be included within the scope of the appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

The invention claimed is:

1. An apparatus, comprising:
a circuit comprising at least a package substrate and a silicon chip; and
an interconnection package disposed on the package substrate of the circuit,
wherein the interconnection package comprises a first set of solder balls that is configured to provide electrical connections for communication channels associated with the silicon chip and a second set of the solder balls associated with an electrical ground for the silicon chip or electric power for the silicon chip,
wherein the first set of solder balls comprises:
a first subset of solder balls configured in a first orientation,
a second subset of solder balls configured in a second orientation that is different than the first orientation,
a third subset of solder balls configured in the first orientation, and
a fourth subset of solder balls configured in the second orientation,
wherein at least one solder ball from the second set of the solder balls is disposed between the first subset of solder balls and the second subset of solder balls,
wherein the first subset of solder balls and the second subset of solder balls are associated with transmitter communication channels, and
wherein the third subset of solder balls and the fourth subset of solder balls are associated with receiver communication channels.

2. The apparatus of claim 1, wherein at least one other solder ball from the second set of the solder balls is disposed between the third subset of solder balls and the fourth subset of solder balls.

3. The apparatus of claim 1, wherein at least one other solder ball from the second set of the solder balls is disposed between the second subset of solder balls and the third subset of solder balls.

4. The apparatus of claim 1, wherein the first set of solder balls is surrounded by solder balls from the second set of the solder balls.

5. The apparatus of claim 1, wherein the electrical connections are first electrical connections, and
wherein the interconnection package comprises a third set of solder balls that is configured to provide second electrical connections for a power supply associated with the silicon chip.

6. The apparatus of claim 5, wherein at least one other solder ball from the second set of the solder balls is disposed between the first set of solder balls and the third set of solder balls.

7. The apparatus of claim 5, wherein the package substrate defines a first side, a second side, a third side, and a fourth side,
wherein the first set of solder balls is arranged along the first side, the second side, and the third side of the package substrate, and
wherein the third set of solder balls is arranged along the fourth side of the package substrate.

8. The apparatus of claim 1, wherein the electrical connections are first electrical connections, and
wherein the interconnection package comprises a third set of solder balls that is configured to provide second electrical connections for auxiliary signals associated with the silicon chip.

9. The apparatus of claim 8, wherein at least one other solder ball from the second set of the solder balls is disposed between the first set of solder balls and the third set of solder balls.

10. The apparatus of claim 9,
wherein the package substrate defines a first side, a second side, a third side, and a fourth side,
wherein the first set of solder balls is arranged along the first side, the second side, and the third side of the package substrate, and
wherein the third set of solder balls is arranged along the fourth side of the package substrate.

11. The apparatus of claim 1, wherein the second orientation associated with the second subset of solder balls is perpendicular with respect to the first orientation associated with the first subset of solder balls.

12. The apparatus of claim 1, wherein the interconnection package is disposed between the package substrate and a printed circuit board.

13. The apparatus of claim 1, wherein the circuit is integrated within a network switch, and wherein the interconnection package is disposed between the network switch and a carrier printed circuit board.

14. The apparatus of claim 1, wherein the circuit is integrated within a network adaptor.

15. The apparatus of claim 1, wherein the circuit is configured as a graphics processing unit, a central processing unit, or a data processing unit.

16. A circuit package system, comprising:
a circuit comprising at least a package substrate and a silicon chip;
a printed circuit board; and
an interconnection package disposed between the package substrate of the circuit and the printed circuit board,
wherein the interconnection package comprises a first set of solder balls that is configured to provide electrical connections for communication channels associated with the silicon chip and a second set of the solder balls associated with an electrical ground for the silicon chip,
wherein the first set of solder balls associated with the communication channels comprises:
a first subset of solder balls configured in a first orientation,
a second subset of solder balls configured in a second orientation that is different than the first orientation,
a third subset of solder balls configured in the first orientation, and
a fourth subset of solder balls configured in the second orientation,
wherein at least one solder ball from the second set of the solder balls is disposed between the first subset of solder balls and the second subset of solder balls,
wherein the first subset of solder balls and the second subset of solder balls are associated with transmitter communication channels, and
wherein the third subset of solder balls and the fourth subset of solder balls are associated with receiver communication channels.

17. The circuit package system of claim 16, wherein at least one other solder ball from the second set of the solder balls is disposed between the third subset of solder balls and the fourth subset of solder balls.

18. The circuit package system of claim 16, wherein at least one other solder ball from the second set of the solder balls is disposed between the second subset of solder balls and the third subset of solder balls.

19. A method, comprising:
configuring an electrical signal via a silicon chip of a circuit; and
transmitting the electrical signal to a printed circuit board via an interconnection package disposed on the circuit,
the interconnection package comprising a first set of solder balls that is configured to provide electrical connections for communication channels associated with the silicon chip and a second set of the solder balls associated with an electrical ground for the silicon chip,
the first set of solder balls comprising:
a first subset of solder balls configured in a first orientation,
a second subset of solder balls configured in a second orientation that is different than the first orientation,
a third subset of solder balls configured in the first orientation, and
a fourth subset of solder balls configured in the second orientation,
wherein at least one solder ball from the second set of the solder balls being disposed between the first subset of solder balls and the second subset of solder balls,
wherein the first subset of solder balls and the second subset of solder balls are associated with transmitter communication channels, and
wherein the third subset of solder balls and the fourth subset of solder balls are associated with receiver communication channels.

20. An apparatus, comprising:
a circuit comprising at least a package substrate and a silicon chip; and
an interconnection package disposed on the package substrate of the circuit,
wherein the interconnection package comprises a first set of solder balls that is configured to provide electrical connections for communication channels associated with the silicon chip and a second set of the solder balls associated with an electrical ground for the silicon chip or electric power for the silicon chip,
wherein the first set of solder balls comprises:
a first subset of solder balls configured in a first orientation,
a second subset of solder balls configured in a second orientation that is different than the first orientation,
a third subset of solder balls configured in the first orientation, and
a fourth subset of solder balls configured in the second orientation
wherein at least one solder ball from the second set of the solder balls is disposed between the first subset of solder balls and the second subset of solder balls, and
wherein a first solder ball and a second solder ball from the first set of solder balls correspond to differential pairs allocated to the communication channels,
wherein the first subset of solder balls and the second subset of solder balls are associated with transmitter communication channels, and
wherein the third subset of solder balls and the fourth subset of solder balls are associated with receiver communication channels.

* * * * *